United States Patent
Ling et al.

(10) Patent No.: US 10,410,038 B2
(45) Date of Patent: **\*Sep. 10, 2019**

(54) OPTICAL FINGERPRINT MODULE

(71) Applicant: Shanghai Oxi Technology Co., Ltd, Shanghai (CN)

(72) Inventors: Yan Ling, Shanghai (CN); Hong Zhu, Shanghai (CN)

(73) Assignee: SHANGHAI OXI TECHNOLOGY CO., LTD, Shanghai (CN)

( * ) Notice: Subject to any disclaimer, the term of this patent is extended or adjusted under 35 U.S.C. 154(b) by 79 days.

This patent is subject to a terminal disclaimer.

(21) Appl. No.: 15/741,979

(22) PCT Filed: Aug. 18, 2016

(86) PCT No.: PCT/CN2016/095845
§ 371 (c)(1),
(2) Date: Jan. 4, 2018

(87) PCT Pub. No.: WO2017/166580
PCT Pub. Date: Oct. 5, 2017

(65) Prior Publication Data
US 2018/0196985 A1    Jul. 12, 2018

(30) Foreign Application Priority Data

Mar. 31, 2016    (CN) .......................... 2016 1 0200824

(51) Int. Cl.
*G06K 9/00*    (2006.01)
*H01L 27/32*    (2006.01)
(Continued)

(52) U.S. Cl.
CPC .......... *G06K 9/0004* (2013.01); *H01L 27/323* (2013.01); *H01L 27/3211* (2013.01);
(Continued)

(58) Field of Classification Search
CPC .. G06K 9/0004; G09G 3/3216; G09G 3/3225; H01L 27/3211; H01L 27/323; H01L 27/3246
See application file for complete search history.

(56) References Cited

U.S. PATENT DOCUMENTS 8,878,790 B2    11/2014    Abele
2004/0252867 A1    12/2004    Lan
(Continued)

FOREIGN PATENT DOCUMENTS

CN    2590070    12/2003
CN    104318205    1/2015
(Continued)

OTHER PUBLICATIONS

International Search Report and Written Opinion from PCT/CN2016/095845 dated Mar. 31, 2016.

*Primary Examiner* — Manuchehr Rahmjoo
(74) *Attorney, Agent, or Firm* — Adsero IP

(57) ABSTRACT

An optical fingerprint module includes: an optical fingerprint sensor having a first surface, a second surface, and a plurality of photosensitive pixels; and an OLED display panel having a third surface and a fourth surface. An OLED device layer is formed between the third surface and the fourth surface; the OLED device layer includes a plurality of display pixels each of which consists of at least one non-opaque region and at least one light blocking region; a light emitting device is provided in the at least one light blocking region; light emitted by the light emitting device at least partially reaches the fourth surface; the light reaching the fourth surface is at least partially used for acquiring a fingerprint image, thereby generating reflective light; the reflective light passes through the non-opaque region, the third surface, the second surface, and enters the plurality of photosensitive pixels.

15 Claims, 4 Drawing Sheets

(51) Int. Cl.
  *G09G 3/3216*  (2016.01)
  *G09G 3/3225*  (2016.01)
(52) U.S. Cl.
  CPC ....... *H01L 27/3246* (2013.01); *G09G 3/3216* (2013.01); *G09G 3/3225* (2013.01)

(56)  References Cited

U.S. PATENT DOCUMENTS

2016/0092717 A1    3/2016  Ling
2017/0078513 A1*   3/2017  Chang .................. G06F 3/0488
2017/0097702 A1*   4/2017  Chang .................... G06F 3/044

FOREIGN PATENT DOCUMENTS

| CN | 104463107 A | 3/2015 |
| CN | 204463157   | 7/2015 |
| CN | 204759454   | 11/2015 |
| JP | 08101914    | 4/1996 |

* cited by examiner

OPTICAL FINGERPRINT MODULE

CROSS-REFERENCE TO RELATED APPLICATIONS

The present application is the national phase of International Application No. PCT/CN2016/095845, filed on Aug. 18, 2016, which claims the benefit of priority to Chinese Patent Application No. 201610200824.2, filed on Mar. 31, 2016, and entitled "OPTICAL FINGERPRINT MODULE", the entire disclosures of which are incorporated herein by reference.

TECHNICAL FIELD

The present disclosure generally relates to optical fingerprint identification field, and more particularly, to an optical fingerprint module.

BACKGROUND

Fingerprint imaging recognition technology is used to realize identification by capturing fingerprint images of a person using optical fingerprint sensors or modules and then determining whether the fingerprint image information matches that already stored in a system. Due to its convenience in use and uniqueness of human fingerprints, the fingerprint recognition technology has been widely applied to various fields, such as security inspection field including Public Security Bureau (PSB) or the like, access control systems of buildings, consumption goods field including personal computers or mobile phones etc., and the like. The fingerprint recognition technology may be realized by optical imaging, capacitance imaging, ultrasound imaging and the like, among which, the optical fingerprint recognition technology is advantageous in the imaging quality and device cost.

As shown in FIG. 1, an existing optical fingerprint module includes a backlight source 110, an optical fingerprint sensor 120, a protective layer 130 and a shell (not shown in FIG. 1). When a fingerprint image is captured, a finger 140 of a person is placed on the protective layer 130. An output light 111 of the backlight source 110 (upward arrows in FIG. 1 represent the output light 111, as enclosed in a dotted line frame) passes through the optical fingerprint sensor 120 and the protective layer 130, and is reflected and transmitted at a contact interface between the finger 140 and the protective layer 130. The reflected light 112 (downward arrows in FIG. 1 represent the reflected light 112, as enclosed in a dotted line frame) passes through the protective layer 130 and irradiates onto the optical fingerprint sensor 120. The optical fingerprint sensor 120 performs photoelectric conversion and signal processing by its inner circuits (not shown in FIG. 1) to realize fingerprint image capturing. Since characteristics of a contact interface between the finger 140 and the protective layer 130 reflect fingerprint characteristics of the finger, and the characteristics of the contact interface directly affect characteristics of the reflected light 112, the image captured by the optical fingerprint sensor 120 shows the fingerprint characteristics of the person.

More information on optical fingerprint modules can refer to the Chinese Utility Model Patent with a publication No. CN203405831U.

However, structures and performance of the existing optical fingerprint modules still remains to be improved.

SUMMARY

An optical fingerprint module is provided according to embodiments of the present disclosure to improve performance of existing optical fingerprint modules.

In some embodiments, the display module may include: an optical fingerprint sensor including a first surface, a second surface and a plurality of photosensitive pixels; wherein the optical fingerprint module further includes: an Organic Light Emitting Diode (OLED) display panel, including a third surface, a fourth surface, and an OLED device layer disposed between the third surface and the fourth surface, where the OLED device layer includes a plurality of display pixels, each of the plurality of display pixels includes at least one non-opaque region and at least one light blocking region, and the at least one light blocking region includes a light-emitting device; light emitted from the light-emitting device at least partially reaches the fourth surface, and the light reaching the fourth surface is at least partially applied to capture a fingerprint image to generate reflected light, and the reflected light returns to the non-opaque region, reaches the third surface, transmits from the third surface to the second surface, and enters the plurality of photosensitive pixels from the second surface.

In some embodiments, the second surface is in direct contact with the third surface, or an optical adhesive layer is disposed between the second surface and the third surface.

In some embodiments, pixel sizes of the optical fingerprint sensor are less than or equal to 100 μm×100 μm, and a distance between the second surface and the fourth surface is less than or equal to 0.5 mm.

In some embodiments, a light collimating layer is disposed between the optical fingerprint sensor and the OLED display panel, and at least partially absorbs light of an oblique direction in the light reaching the second surface from the third surface, and allows at least partial vertical light or quasi-vertical light to enter the second surface.

In some embodiments, sizes of the plurality of photosensitive pixels are less than 100 μm×100 μm, and a distance between the second surface and the fourth surface is less than 5 mm.

In some embodiments, the OLED display panel includes a first non-opaque substrate and a second non-opaque substrate, the first non-opaque substrate has the third surface, the second non-opaque substrate has the fourth surface, and the OLED device layer is disposed between the first non-opaque substrate and the second non-opaque substrate.

In some embodiments, the plurality of display pixels are isolated display pixels, each of the isolated display pixels includes the light-emitting device, the light-emitting device includes a first electrode and a second electrode, all first electrodes are isolated from each other, all second electrodes are isolated from each other, and the second electrode is made of a light blocking conductive material.

In some embodiments, one or more of the isolated display pixels exactly face one of the plurality of photosensitive pixels; and when one of the isolated display pixels exactly faces one of the plurality of photosensitive pixels, an area of each of the isolated display pixels is equal to an area of each of the plurality of photosensitive pixels.

In some embodiments, light emitted by the isolated display pixels includes white light, violet light, blue light, cyan light, green light, yellow light, orange light, red light, or near-infrared light; or each of the isolated display pixels includes three sub pixels, and the three sub pixels include a red sub pixel, a green sub pixel, and a blue sub pixel respectively.

In some embodiments, the plurality of display pixels are passive display pixels arranged in an array, each of the passive display pixels includes the light-emitting device, the light-emitting device includes a first electrode connected with a data line in a first axial direction and a second electrode connected with a data line in a second axial direction, and the second electrode is made of a non-opaque conductive material.

In some embodiments, the plurality of display pixels are active display pixels arranged in an array, each of the active display pixels includes the light-emitting device, the light-emitting device includes a first electrode and a second electrode, each of the active display pixels is connected with a data line and a scanning line, and the second electrode is made of a non-opaque conductive material.

In some embodiments, each of the active display pixels includes an element region, a light-emitting device region and a surrounding region, the element region and the light-emitting device region are light blocking regions, and the surrounding region is a non-opaque region.

In some embodiments, the OLED display panel provides light as a light source when the optical fingerprint sensor captures fingerprint.

In some embodiments, the optical fingerprint module further includes a protective layer, where the OLED display panel is disposed between the protective layer and the optical fingerprint sensor.

In some embodiments, a touch-sensitive layer is disposed between the second non-opaque substrate and the protective layer, or between the second non-opaque substrate and the OLED device layer.

Compared with the prior art, the present disclosure has the following advantages.

By virtue of a nature of light being able to pass through the OLED display panel, the OLED display panel and the optical fingerprint sensor are arranged together, so that light emitted from the OLED display panel can be used for the optical fingerprint sensor to capture fingerprint images. Therefore, it is not necessary to specially configure a light source for the optical fingerprint sensor, thereby saving cost and simplifying structures. By disposing the OLED device layer in the OLED display panel, the plurality of display pixels can be divided into a light blocking region and a non-opaque region, so as to ensure that the OLED display panel can display information well, and further to ensure that the optical fingerprint sensor can capture fingerprint well. Therefore, the fingerprint capturing function and information display function can be integrated together in the optical fingerprint module, which broadens application range of the optical fingerprint module.

Further, upper positions of the plurality of display pixels in the OLED display panel correspond to lower positions of the plurality of photosensitive pixels in the optical fingerprint sensor, so as to better ensure that light can reach the optical fingerprint sensor more uniformly, and further to ensure that the fingerprint capturing function of the entire optical fingerprint module can be maintained at a high level.

DETAILED DESCRIPTION

As described in the background art, functions of the existing optical fingerprint modules are relatively single, and applications of the existing optical fingerprint modules are subject to a certain restriction.

In view of above, an optical fingerprint module is provided in the present disclosure, where an optical fingerprint sensor and an Organic Light Emitting Diode (OLED) display panel are subtly disposed in a same module by utilizing unique properties of the OLED display panel, which not only simplifies the design structure and the corresponding manufacture process, but also provides the optical fingerprint module with the display information function, thereby making the optical fingerprint module more functional and widely applied.

The foregoing objects, features and advantages of the present disclosure will become more apparent from the following detailed description of specific embodiments in conjunction with the accompanying drawings.

Figure 1:
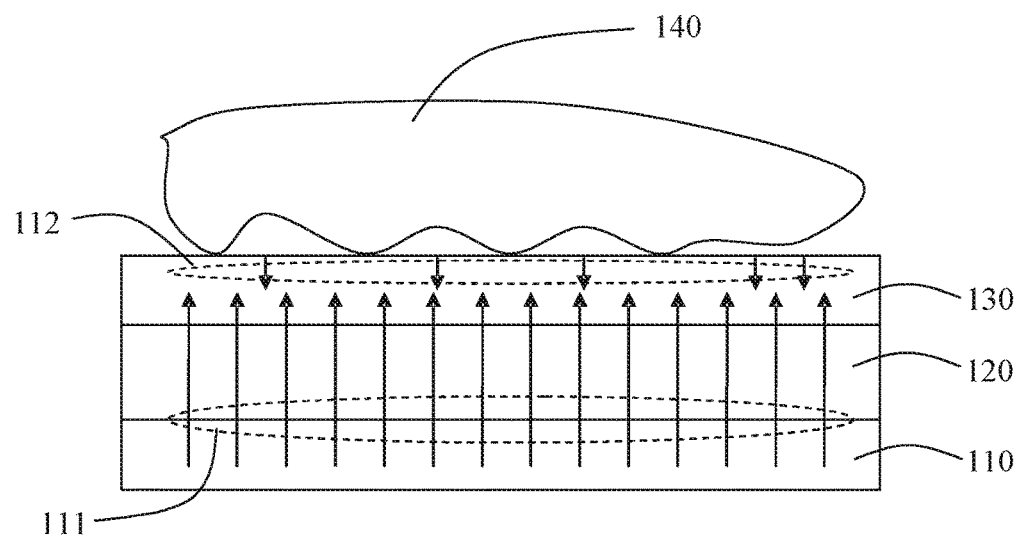
FIG. 1 schematically illustrates a structural diagram of an optical fingerprint module in a conventional technology.
Figure 2:
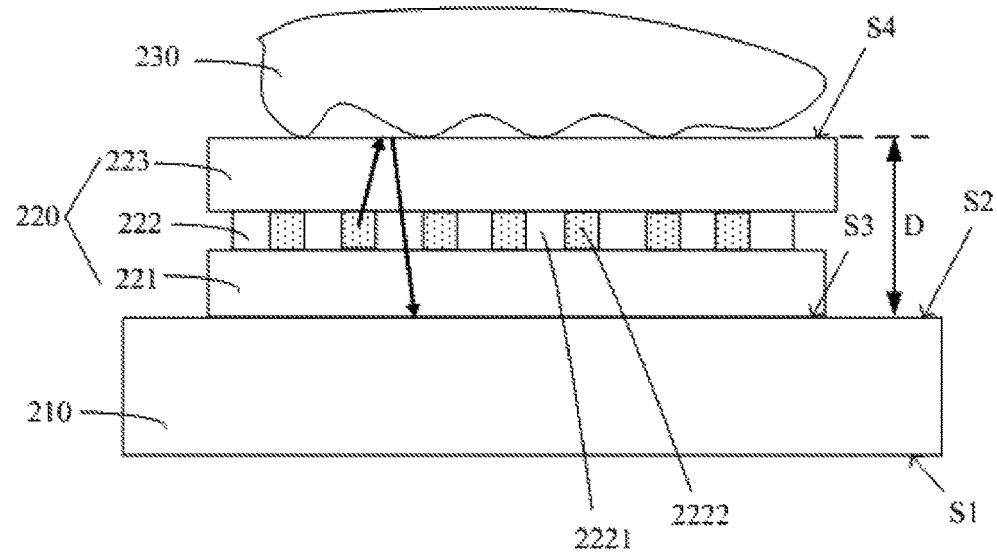
FIG. 2 schematically illustrates a cross-sectional view of an optical fingerprint module according to an embodiment of the present disclosure.
Figure 3:
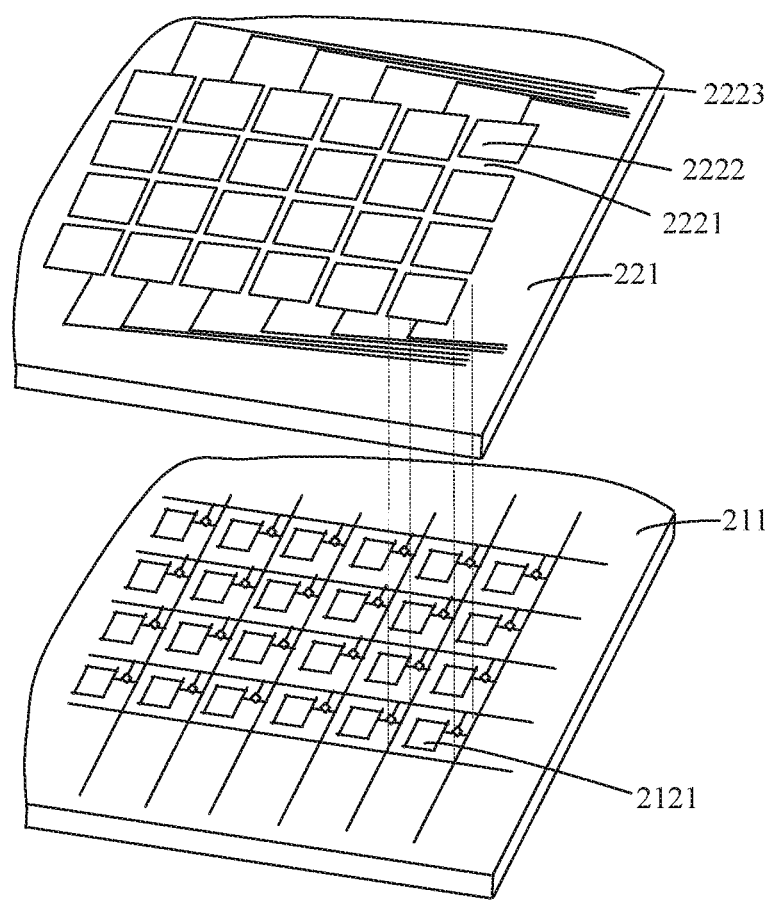
FIG. 3 schematically illustrates a structural diagram of an Organic Light Emitting Diode (OLED) display panel and an optical fingerprint sensor of the optical fingerprint module shown in FIG. 2.

An optical fingerprint module is provided according to an embodiment of the present disclosure. With reference to FIGS. 2 and 3, the optical fingerprint module may include an optical fingerprint sensor 210 and an OLED display panel 220. The optical fingerprint sensor 210 has a first surface S1 and a second surface S2 and may include a plurality of photosensitive pixels 2121 (referring to FIG. 3). The OLED display panel 220 has a third surface S3 and a fourth surface S4 and may include a plurality of display pixels (not shown), each of the plurality of display pixels (not shown) may include a light blocking region 2222 and a non-opaque region 2221 (referring to FIG. 3), and the light blocking region 2222 at least includes a light-emitting device (not shown).

In some embodiments, the plurality of display pixels may be isolated display pixels (not shown), and each of the isolated display pixels may include the light blocking region 2222 and the non-opaque region 2221 (referring to FIG. 3).

In some embodiments, the light blocking region 2222 may include at least the light-emitting device, and the light-emitting device may include an anode layer (not shown) and a cathode layer (not shown), wherein the anode layer may be a first electrode (or a second electrode), the cathode layer may be a second electrode (or a first electrode). When the anode layer is closer to the third surface S3 than the cathode layer, the anode layer may be made of a light blocking material such as metal etc., so as to form the light blocking region 2222. Conversely, when the cathode layer is closer to the third surface S3 than the anode layer, the cathode layer may be made of a light blocking material such as metal etc. so as to form the light blocking region 2222.

In some embodiments, the non-opaque region 2221 allows light to pass through the OLED display panel 220. Specifically, the light can pass through the OLED display panel 220 along a thickness direction of the OLED display panel 220.

As shown in FIG. 2, light emitted by the light-emitting device at least partially reaches the fourth surface S4, the light reaching the fourth surface S4 is at least partially applied to capture a fingerprint image, thereby generating reflected light, and the reflected light returns to the non-opaque region 2221, reaches the third surface S3, transmits from the third surface S3 to the second surface S2, and then enters the plurality of photosensitive pixels from the second surface S2.

In some embodiments, the first surface S1 and the second surface S2 of the optical fingerprint sensor 210 are two outermost surfaces of the optical fingerprint sensor 210. For example, when the first surface S1 is an upper surface, the second surface S2 is a lower surface; and conversely, when the second surface S2 is an upper surface, the first surface S1 is a lower surface.

In some embodiments, the third surface S3 and the fourth surface S4 of the OLED display panel 220 are two outermost surfaces of the OLED display panel 220. For example, when the third surface S3 is an upper surface, the fourth surface S4 is a lower surface; and conversely, when the fourth surface S4 is an upper surface, the third surface S3 is a lower surface.

In some embodiments, the optical fingerprint sensor 210 may be an image sensor based on a silicon wafer manufactured by a Complementary Metal Oxide Semiconductor (CMOS) process, or an image sensor based on a glass substrate manufactured by a Thin Film Transistor (TFT) process.

In some embodiments, light can pass through the OLED display panel 220 uniformly, and all non-opaque regions 2221 are evenly distributed on a plan view of the OLED display panel 220.

In some embodiments, although not shown in FIGS. 2 and 3, an optical adhesive layer is disposed between the second surface S2 and the third surface S3. The optical adhesive layer can prevent multiple reflections and scatterings on interfaces between different substrates and air, thereby preventing definition of the fingerprint image from decreasing. The optical adhesive layer may be made of a pressure-sensitive optical adhesive, a thermosensitive optical adhesive or a photosensitive optical adhesive.

In some embodiments, sizes of the plurality of photosensitive pixels 2121 of the optical fingerprint sensor 210 are less than or equal to 100 μm×100 μm, and a distance between the second surface S2 and the fourth surface S4 is less than or equal to 0.5 mm. Normally, the isolated display pixels emit stray light at various angles, and a distance D between the second surface S2 and the fourth surface S4 cannot be too large in order to acquire a clear fingerprint image. When the size of each of the plurality of photosensitive pixels 2121 of the optical fingerprint sensor 210 is 100 μm×100 μm, the distance D is controlled to be less than 0.5 mm, so as to ensure capturing of a clear fingerprint image. Normally, the smaller the size of each of the plurality of photosensitive pixels 2121 is, the smaller the value of the distance D is required.

In some embodiments, the OLED display panel 220 may include a first non-opaque substrate 221 and a second non-opaque substrate 223, and an OLED device layer 222 disposed between the first non-opaque substrate 221 and the second non-opaque substrate 223. The OLED device layer 222 consists of the non-opaque region 2221 and the light blocking region 2222, and the light blocking region 2222 includes at least a light-emitting device.

Since the OLED display panel 220 is a self-luminous device, an external light source is not required. The first non-opaque substrate 221 and the second non-opaque substrate 223 may be glass rigid substrates, or plastic film substrates such as polyimide (PI) or polyethylene terephthalate (PET) and so on, where the plastic film substrates are non-opaque, flexible and foldable.

A sealant (not shown) may be disposed around the OLED display panel 220 to seal the OLED device layer 222 in the OLED display panel 220 so as to isolate moisture and air from the OLED device layer 222.

The first non-opaque substrate 221 and the second non-opaque substrate 223 may be as thin as several tens of micrometers (μm) respectively, while a thickness of the OLED device layer 222 may be only several μm, therefore a total thickness of the OLED display panel 220 can be as thin as 100 μm or less, to be flexible and foldable.

In some embodiments, the OLED device layer 222 may include an anode layer (not shown), an organic light-emitting layer (not shown) and a cathode layer (not shown). At least one of the anode layer and the cathode layer is made of a non-opaque material, for example, Indium Tin Oxides (ITO), graphene, nano-silver, carbon nanotube, aluminum-doped zinc oxide and the like, so that light can be emitted from the OLED device layer 222.

Although not shown in FIGS. 2 and 3, in some embodiments, the OLED device layer 222 may further include one or more of a Hole Injection Layer (HIL), a Hole Transporting Layer (HTL), an Electron Transporting Layer (ETL) and an Electron Injection Layer (EIL). These layers are added to form different energy level states, so that holes produced by the anode layer and electrons produced by the cathode layer can be more easily transferred to the organic light-emitting layer to be recombined, thereby making it easier to emit photons and improve the luminous efficiency. Appropriate amount of doping may be added to the HIL, the HTL, the organic light-emitting layer (EL), the ETL and the EIL to adjust the required energy level states.

Referring to FIG. 3, a plurality of data lines (not marked) in a first axial direction and a plurality of scanning lines (not marked) in a second axial direction are disposed on a substrate 211 of the optical fingerprint sensor 210. The plurality of data lines and the plurality of scanning lines define a plurality of grid regions, and the plurality of photosensitive pixels 2121 arranged in an array are disposed in corresponding grids. Other configurations of the optical fingerprint sensor 210 are omitted in FIG. 3, but it should be noted that, the optical fingerprint sensor 210 may further include a peripheral circuit and so on, where the peripheral circuitry may include a drive circuit, a signal readout chip bonding region, a flexible printed circuit board bonding region, and lead wires connecting the chip readout chip bonding region and the flexible printed circuit board bonding region.

Referring to FIG. 3, the OLED device layer 222 (not shown) is disposed on the first non-opaque substrate 221, the OLED device layer 222 may include a plurality of isolated display pixels, where each of the plurality of isolated display pixels may include a first electrode (not shown) and a second electrode (not shown), each first electrode is connected with an outside of the pixel region (not shown) via one of lead wires 2223, and all of the second electrodes are electrically connected as a common electrode of an entire surface. The isolated display pixels 2223 are individually connected with a corresponding control circuit via one of the lead wires 2223. In some embodiments, the lead wires 2223 may be made of a transparent conductive material.

In some embodiments, one of the plurality of photosensitive pixels 2121 exactly faces one of the plurality of isolated display pixels, and an area of each of the plurality of photosensitive pixels 2121 is equal to an area of each of the plurality of isolated display pixels. Since areas of the two kinds of pixels are equal, it is not necessary for the photosensitive pixels and the isolated display pixels to be aligned one by one, and a certain dislocation may be exist therebetween. In a macroscopic view, an alignment relationship between each of the plurality of photosensitive pixels 2121 and each of the isolated display pixels is uniform, thereby ensuring that the transmitted or reflected optical signals received by each of the plurality of photosensitive pixels 2121 are uniform.

In other embodiments, one of the plurality of photosensitive pixels 2121 may exactly face two or more of the plurality of isolated display pixels. In a macroscopic view, an alignment relationship between each of the plurality of photosensitive pixels 2121 and the two or more of the plurality of isolated display pixels is uniform, thereby ensuring that the transmitted or reflected optical signals received by each of the plurality of photosensitive pixels 2121 are uniform.

In some embodiments, light emitted by the isolated display pixels may be one of white light, violet light, blue light, cyan light, green light, yellow light, orange light, red light, or near-infrared light.

In other embodiments, the isolated display pixels may include three sub pixels, i.e. a red sub pixel, a green sub pixel and a blue sub pixel respectively. When the above three sub pixels are disposed, each of the three sub pixels may be electrically connected with a corresponding drive circuit via a lead wire.

In some embodiments, the finger 230 directly presses an upper surface (i.e. the fourth surface S4) of the second non-opaque substrate 223 of the OLED display panel 220. That is, the upper surface of the second non-opaque substrate 223 of the OLED display panel 220 is configured for direct contact with fingers. In other embodiments, the optical fingerprint module may further include a protective layer, and the OLED display panel 220 may be disposed between the protective layer and the optical fingerprint sensor 210, in which case fingers may be in direct contact with an outer surface of the protective layer, and the protective layer may be a single layer or a multilayer.

It is difficult to combine the display function with the fingerprint capturing function, because the two functions may have an adverse affect on each other when being implemented. In the optical fingerprint module according to embodiments of the present disclosure, by virtue of a nature of light being able to pass through the OLED display panel 220, the OLED display panel 220 and the optical fingerprint sensor 210 are disposed together, so that light emitted from the OLED display panel 220 can be used for the optical fingerprint sensor 210 to capture fingerprint images. Therefore, it is not necessary to specially configure a light source for the optical fingerprint sensor 210, thereby saving cost and simplifying structures. In addition, each of the plurality of display pixels in the OLED display panel 220 is divided into a non-opaque region 2221 and a light blocking region 2222, thereby ensuring that the OLED display panel 220 can display information well, and further ensuring that the optical fingerprint sensor 210 can capture fingerprint well. Therefore, the fingerprint capturing function and information display function can be integrated together in the optical fingerprint module, which broadens an application range of the optical fingerprint module.

That is, the OLED display panel 220 and the optical fingerprint sensor 210 according to embodiments of the present disclosure are disposed together by virtue of a characteristic property (i.e. a certain non-opaque property) of the OLED display panel 220 and properties of the optical fingerprint sensor 210, and functions of the OLED display panel 220 and functions of the optical fingerprint sensor 210 can be superimposed by a mutual cooperation of these structures in use, so that the entire optical fingerprint module not only has a fingerprint capturing function, but also has a displaying information function.

In addition, in embodiments of the present disclosure, lower positions of the plurality of isolated display pixels in the OLED display panel 220 correspond to upper positions of the photosensitive pixels 2121 in the optical fingerprint sensor 210, so as to better ensure that the light emitted from the OLED display panel 220 can reach the optical fingerprint sensor 210 more uniformly, and thus to ensure that the fingerprint capturing function of the entire optical fingerprint module is still maintained at a high level.

Figure 4:
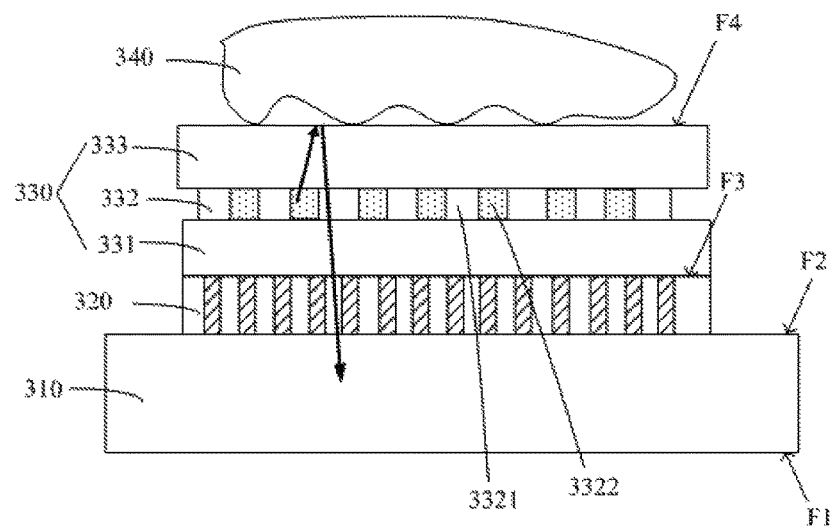
FIG. 4 schematically illustrates a cross-sectional view of an optical fingerprint module according to another embodiment of the present disclosure.
Figure 5:
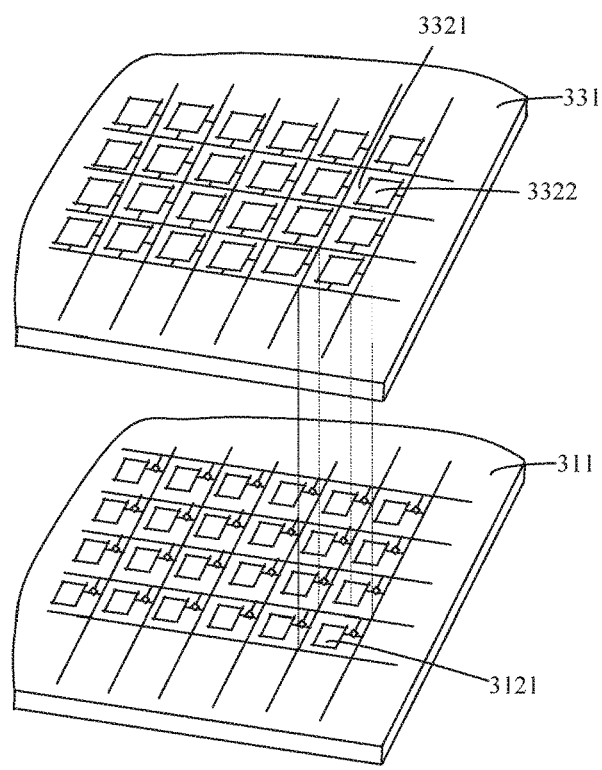
FIG. 5 schematically illustrates a structural diagram of an OLED display panel and an optical fingerprint sensor of the optical fingerprint module shown in FIG. 4.

An optical fingerprint module is provided according to another embodiment of the present disclosure. With reference to FIGS. 4 and 5, the optical fingerprint module may include an optical fingerprint sensor 310 and an OLED display panel 330. The optical fingerprint sensor 310 has a first surface F1 and a second surface F2 and may include a plurality of photosensitive pixels 3121 (referring to FIG. 5). The OLED display panel 330 has a third surface F3 and a fourth surface F4 and may include a plurality of display pixels (not shown). Each of the plurality of display pixels includes a light blocking region 3322 and a non-opaque region 3321 (referring to FIG. 4), where the light blocking region 3322 may include at least a light-emitting device (not shown in FIG. 4).

In some embodiments, the light blocking region 3322 may include at least the light-emitting device, and the light-emitting device may include an anode layer and a cathode layer, where the anode layer may be a first electrode (or a second electrode), the cathode layer may be a second electrode (or a first electrode). When the anode layer is closer to the third surface F3 than the cathode layer, the anode layer may be made of a light blocking material such as metal etc. so as to form the light blocking region 3322. Conversely, when the cathode layer is closer to the third surface F3 than the anode layer, the cathode layer may be made of a light blocking material such as metal etc.

In some embodiments, the non-opaque region 3321 allows light to pass through the OLED display panel 330. Specifically, the light may pass through the OLED display panel 330 along a thickness direction of the OLED display panel 330.

Light emitted by the light-emitting device in the light blocking region 3322 of each of the plurality display pixels at least partially reaches the fourth surface F4, the light reaching the fourth surface F4 is at least partially applied to capture a fingerprint image to generate reflected light, and the reflected light returns to the non-opaque region 3321, reaches the third surface F3, transmits from the third surface F3 to the second surface F2, and enters photosensitive devices (not shown) of the plurality of photosensitive pixels 3121 from the second surface F2.

Referring to FIG. 5, in some embodiments, the optical fingerprint sensor 310 has a first surface F1 and a second surface F2 and may include a plurality of photosensitive pixels 3121.

In some embodiments, the OLED display panel 330 may include a first non-opaque substrate 331 and a second non-opaque substrate 333, and an OLED device layer 332 disposed between the first non-opaque substrate 331 and the second non-opaque substrate 333.

Referring to FIG. 5, a plurality of first data lines (not marked) in a first axial direction and a plurality of second data lines (not marked) in a second axial direction are arranged on a substrate 311 of the optical fingerprint sensor 310. The plurality of first data lines and the plurality of second data lines in the two axial directions define a plurality of grid regions, and the plurality of photosensitive pixels 3121 arranged in an array are disposed in corresponding grids. Other configurations of the optical fingerprint sensor 310 are omitted in FIG. 5, but it should be noted that, the optical fingerprint sensor 310 may further include a peripheral circuit and so on, where the peripheral circuitry may include a drive circuit, a signal readout chip bonding region, a flexible printed circuit board bonding region, and lead wires connecting the chip readout chip bonding region and the flexible printed circuit board bonding region.

Referring to FIG. 5, the OLED device layer 332 (not shown) is disposed on the first non-opaque substrate 331, and the OLED device layer 332 may include a plurality of passive display pixels arranged in an array. First electrodes of each row of passive display pixels are connected with a same first data line (not shown) in the first axial direction, and second electrodes of each column of the passive display pixels are connected with a same second data line (not shown) in the second axial direction. The plurality of first data lines and the plurality of second data lines are insulated from each other.

The first electrodes are insulated from each other, and the second electrodes are insulated from each other. The first electrodes may be made of a transparent conductive material. The second electrodes may be made of a light blocking conductive material, for example, a metal material.

In some embodiments, one of the plurality of photosensitive pixels 3121 exactly faces one of the plurality of passive display pixels. As shown in FIG. 5, two ends of the four dashed lines are respectively connected with four vertices of each of two pixels at the two ends, indicating that if the two pixels move along the dashed line, the two pixels can be substantially coincident. That is, areas of the two pixels are equal. Since each of the plurality of photosensitive pixels and each of the plurality of passive display pixels have a same area, it is not necessary for the plurality of photosensitive pixels and the plurality of passive display pixels to be aligned one by one, and a certain dislocation may be exist therebetween. In a macroscopic view, an alignment relationship between each of the plurality of photosensitive pixels 3121 and each of the passive display pixels is uniform, thereby ensuring that the optical signals received by each of the plurality of photosensitive pixels 3121 are uniform.

In other embodiments, one of the plurality of photosensitive pixels 3121 may exactly face two or more of the plurality of display pixels (i.e. passive display pixels). In a macroscopic view, an alignment relationship between each of the plurality of photosensitive pixels 3121 and the two or more display pixels is uniform, thereby ensuring that the optical signals received by each of the plurality of photosensitive pixels 3121 are uniform.

In some embodiments, light emitted by the plurality of passive display pixels may be one of white light, violet light, blue light, cyan light, green light, yellow light, orange light, red light, or near-infrared light.

In other embodiments, each of the passive display pixels may include three sub pixels, i.e. a red sub pixel, a green sub pixel, and a blue sub pixel respectively.

In some embodiments, a finger 340 directly presses an upper surface (i.e. the fourth surface F4) of the second non-opaque substrate 333 of the OLED display panel 330. That is, the upper surface of the second non-opaque substrate 333 of the OLED display panel 330 is configured for direct contact with fingers. In other embodiments, the optical fingerprint module may further include a protective layer (not shown), and the OLED display panel 330 may be disposed between the protective layer and the optical fingerprint sensor 310, in which case the finger may be in direct contact with an outer surface of the protective layer, and the protective layer may be a single layer or a multilayer.

Referring to FIG. 4, in some embodiments, a light collimating layer 320 (not shown in FIG. 5) is disposed between the optical fingerprint sensor 310 and the OLED display panel 330.

The light collimating layer 320 is applied to allow only light within a certain range of angles to pass. That is, the light collimating layer 320 at least partially absorbs light of an oblique direction in all the light reaching the second surface F2 from the third surface F3, and allows at least partial vertical light or quasi-vertical light to enter the second surface F2. Since the light collimating layer 320 only allows light within a certain range of angles to pass, and the portion of light that passes is perpendicular to or nearly perpendicular to the second surface F2, optical signals with oblique incident angles are filtered out by the light collimating layer 320.

In some embodiments, light reflected by the OLED display panel 330 is filtered by the light collimating layer 320 and becomes parallel light or quasi-parallel light, where the quasi-parallel light refers to a maximum angle difference between all rays of the light is within ten degrees. Specifically, the light collimating layer 320 may include a light blocking frame and a plurality of non-opaque holes (not shown) uniformly distributed in the light blocking frame (not shown), and when stray light enters the plurality of non-opaque holes, it will be absorbed by the light blocking frame, thereby allowing only light at a relatively vertical angle to pass, so that the light collimating layer 320 can achieve an effect of light collimating.

Therefore, the light emitted from the OLED display panel 330 is reflected at a contact interface between the finger 340 and the OLED display panel 330, and is filtered by the light collimating layer 320 to become parallel light or quasi-parallel light. The parallel light or quasi-parallel light is more beneficial to obtain clear and high-quality fingerprint images.

In some embodiments, a total thickness of the OLED display panel 330 and the light collimation layer 320 is less than or equal to 5 mm. Since the light returned by the OLED display panel 330 is filtered to become parallel light or quasi-parallel light, it is not easy for the reflected light to interfere with each other among the surfaces. Therefore, a thickness of the OLED display panel 330 and a thickness of the light collimating layer 320 may generally have a larger selection range. However, the total thickness of the OLED display panel 330 and the light collimating layer 320 is normally controlled to be less than or equal to 5 mm in consideration of a size and a weight of a final product.

More information on structures and advantages of the optical fingerprint module according to the present embodiment can be referred to the corresponding descriptions in the foregoing embodiments.

Figure 6:
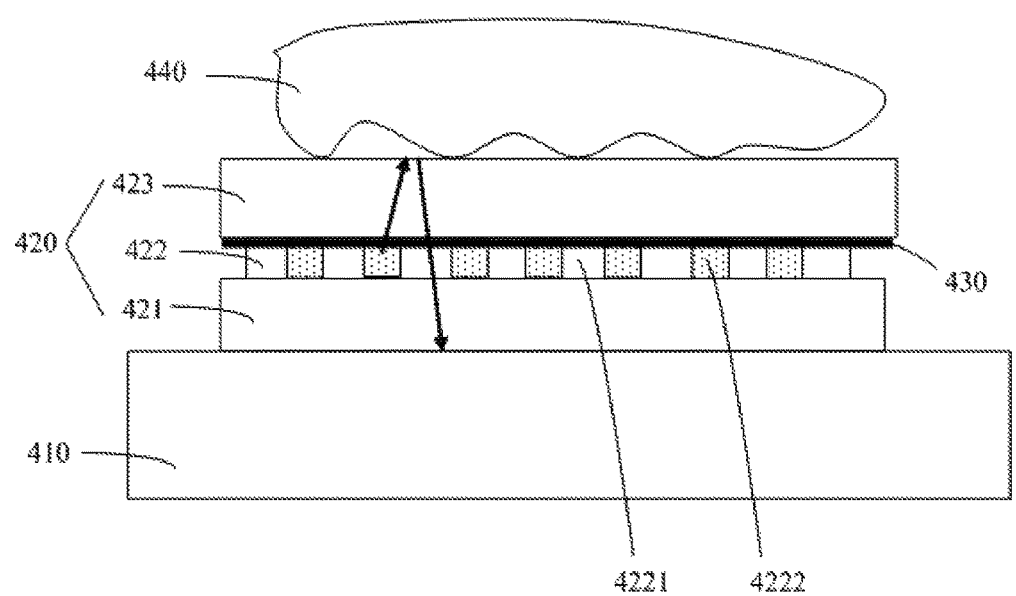
FIG. 6 schematically illustrates a cross-sectional view of an optical fingerprint module according to another embodiment of the present disclosure.
Figure 7:
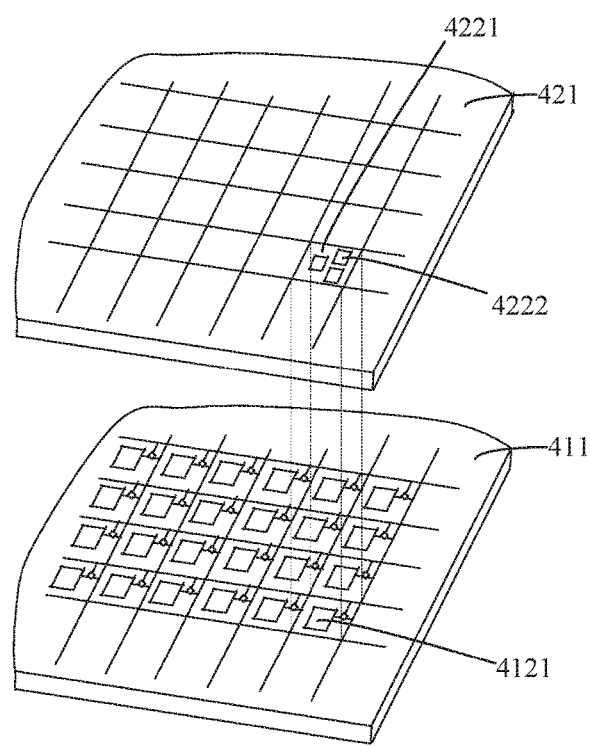
FIG. 7 schematically illustrates a structural diagram of an OLED display panel and an optical fingerprint sensor of the optical fingerprint module shown in FIG. 6.

An optical fingerprint module is provided according to another embodiment of the present disclosure. With reference to FIGS. 6 and 7, in some embodiments, the optical fingerprint module may include an optical fingerprint sensor 410 and an OLED display panel 420.

The optical fingerprint sensor 410 has a first surface (not shown) and a second surface (not shown), and may include a plurality of photosensitive pixels 4121 (referring to FIG. 7). The OLED display panel 420 has a third surface (not shown) and a fourth surface (not shown), and may include a plurality of display pixels (now shown). Each of the plurality of display pixels may include at least one light blocking region 4222 and at least one non-opaque region 4221 (referring to FIG. 6), and the at least one non-opaque region 4222 may include at least a light emitting device (not shown).

In some embodiment, the non-opaque region 4221 allows light to pass through the OLED display panel 420. Specifically, the light may pass through the OLED display panel 420 along a thickness direction of the OLED display panel 420.

Light emitted by the plurality of display pixels at least partially reaches the fourth surface, the light reaching the fourth surface is at least partially applied to capture a fingerprint image to generate reflected light, and the reflected light returns to the non-opaque region 4221, reaches the third surface, transmits from the third surface to the second surface, and enters photosensitive devices (not shown) of the plurality of photosensitive pixels 4121 from the second surface.

In some embodiments, the OLED display panel 420 may include a first non-opaque substrate 421 and a second non-opaque substrate 423, and an OLED device layer 422 disposed between the first non-opaque substrate 421 and the second non-opaque substrate 423.

Referring to FIG. 7, a plurality of data lines (not shown) in a first axial direction and a plurality of scanning lines (not shown) in a second axial direction are disposed on a substrate 411 of the optical fingerprint sensor 410. The plurality of data lines and the plurality of scanning lines define a plurality of grid regions, and the plurality of photosensitive pixels 4121 arranged in an array are disposed in corresponding grids. Other configurations of the optical fingerprint sensor 410 are omitted in FIG. 7, but it should be noted that, the optical fingerprint sensor 410 may further include a peripheral circuit and so on, where the peripheral circuitry may include a drive circuit, a signal readout chip bonding region, a flexible printed circuit board bonding region, and lead wires connecting the chip readout chip bonding region and the flexible printed circuit board bonding region.

Referring to FIG. 7, the OLED device layer 422 (referring to FIG. 6) is disposed on the first non-opaque substrate 421, and the OLED device layer 422 may include a plurality of active display pixels arranged in an array, where each of the plurality of active display pixels may include a light blocking region 4222 and a non-opaque region 4221, and the light blocking region 4222 may include at least one light emitting device (not shown).

Each of the plurality of active display pixels may include a light emitting device and one or more TFT devices (not shown), and is connected with a corresponding data line (not shown) and a corresponding scanning line (not shown) through the one or more TFT devices. The light emitting device may include an anode layer and a cathode layer, wherein the anode layer may be a first electrode (or a second electrode), and the cathode layer may be a second electrode (or a first electrode). When the anode layer is closer to the third surface than the cathode layer, the anode layer may be made of a light blocking material such as metal etc. to form the light blocking region. Conversely, when the cathode layer is closer to the third surface than the anode layer, the cathode layer may be made of a light blocking material such as metal etc.

Referring to FIG. 7, in some embodiments, one of the plurality of photosensitive pixels 4121 exactly faces one of the plurality of active display pixels. In other embodiments, one of the plurality of photosensitive pixels 4121 may exactly face two or more of the plurality of active display pixels.

In some embodiments, a finger 440 directly presses an upper surface (the fourth surface) of the second non-opaque substrate 423 of the OLED display panel 420. That is, the upper surface of the second non-opaque substrate 423 of the OLED display panel 420 is configured for direct contact with fingers. In other embodiments, the optical fingerprint module may further include a protective layer, and the OLED display panel 420 may be disposed between the protective layer and the optical fingerprint sensor 410, in which case fingers may be in direct contact with an outer surface of the protective layer, and the protective layer may be a single layer or a multilayer.

In some embodiments, a touch-sensitive layer 430 is disposed between the second non-opaque substrate 423 and the OLED device layer 422, and provides the entire optical fingerprint module with a touch sensitive function, so that an application range of the optical fingerprint module can be broadened. In other embodiments, the optical fingerprint module may further include the aforementioned protective layer, and a touch-sensitive layer is disposed between the second non-opaque substrate 423 and the protective layer.

In some embodiments, an operating time of the touch-sensitive layer 430 does not conflict with an operating time of the OLED display panel 420. Therefore, it is not necessary to consider an operating time match between the touch-sensitive layer 430 and the OLED display panel 420. Likewise, the operating time of the touch-sensitive layer 430 does not conflict with an operating time of the optical fingerprint sensor 410. Therefore, it is not necessary to consider an operating time match between the touch-sensitive layer 430 and the optical fingerprint sensor 410.

Referring to FIG. 7, in some embodiments, each of the plurality of active display pixels may include an element region (not shown), a light emitting device region (not shown) and a surrounding region (not shown). In some embodiment, the element region is a light blocking region, and the surrounding region is a non-opaque region. The surrounding region is a part of the non-opaque region, and the light emitting device region is a part of the light blocking region.

More information on structures and advantages of the optical fingerprint module according to embodiments of the present disclosure can be referred to corresponding descriptions of the foregoing embodiments.

Although the present disclosure has been described above, the present disclosure is not limited thereto. It should be understood by those skilled in the art that various changes and modifications may be made without departing from the spirit and scope of the disclosure, and therefore, the scope of the disclosure should be limited by the scope of the claims.

What is claimed is:

1. An optical fingerprint module comprising:
an optical fingerprint sensor comprising a first surface, a second surface and a plurality of photosensitive pixels; wherein the optical fingerprint module further comprises:
an Organic Light Emitting Diode (OLED) display panel, comprising a third surface, a fourth surface, and an OLED device layer disposed between the third surface and the fourth surface, where the OLED device layer comprises a plurality of display pixels, each of the plurality of display pixels comprises at least one non-opaque region and at least one light blocking region, and the at least one light blocking region comprises a light-emitting device;
light emitted from the light-emitting device at least partially reaches the fourth surface, and the light reaching the fourth surface is at least partially applied to capture a fingerprint image to generate reflected light, and the reflected light returns to the non-opaque region, reaches the third surface, transmits from the third surface to the second surface, and enters the plurality of photosensitive pixels from the second surface.

2. The optical fingerprint module according to claim 1, wherein the second surface is in direct contact with the third surface, or an optical adhesive layer is disposed between the second surface and the third surface.

3. The optical fingerprint module according to claim 2, wherein pixel sizes of the optical fingerprint sensor are less than or equal to 100 μm×100 μm, and a distance between the second surface and the fourth surface is less than or equal to 0.5 mm.

4. The optical fingerprint module according to claim 1, wherein a light collimating layer is disposed between the optical fingerprint sensor and the OLED display panel, and at least partially absorbs light of an oblique direction in the light reaching the second surface from the third surface, and allows at least partial vertical light or quasi-vertical light to enter the second surface.

5. The optical fingerprint module according to claim 4, wherein sizes of the plurality of photosensitive pixels are less than 100 μm×100 μm, and a distance between the second surface and the fourth surface is less than 5 mm.

6. The optical fingerprint module according to claim 1, wherein the OLED display panel comprises a first non-opaque substrate and a second non-opaque substrate, the first non-opaque substrate has the third surface, the second non-opaque substrate has the fourth surface, and the OLED device layer is disposed between the first non-opaque substrate and the second non-opaque substrate.

7. The optical fingerprint module according to claim 6, wherein the plurality of display pixels are isolated display pixels, each of the isolated display pixels comprises the light-emitting device, the light-emitting device comprises a first electrode and a second electrode, all first electrodes are isolated from each other, all second electrodes are isolated from each other, and the second electrode is made of a light blocking conductive material.

8. The optical fingerprint module according to claim 7, wherein one or more of the isolated display pixels exactly face one of the plurality of photosensitive pixels; and when one of the isolated display pixels exactly faces one of the plurality of photosensitive pixels, an area of each of the isolated display pixels is equal to an area of each of the plurality of photosensitive pixels.

9. The optical fingerprint module according to claim 7, wherein light emitted by the isolated display pixels comprise white light, violet light, blue light, cyan light, green light, yellow light, orange light, red light, or near-infrared light; or each of the isolated display pixels comprises three sub pixels, and the three sub pixels comprise a red sub pixel, a green sub pixel, and a blue sub pixel respectively.

10. The optical fingerprint module according to claim 6, wherein the plurality of display pixels are passive display pixels arranged in an array, each of the passive display pixels comprises the light-emitting device, the light-emitting device comprises a first electrode connected with a data line in a first axial direction and a second electrode connected with a data line in a second axial direction, and the second electrode is made of a non-opaque conductive material.

11. The optical fingerprint module according to claim 6, wherein the plurality of display pixels are active display pixels arranged in an array, each of the active display pixels comprises the light-emitting device, the light-emitting device comprises a first electrode and a second electrode, each of the active display pixels is connected with a data line and a scanning line, and the second electrode is made of a non-opaque conductive material.

12. The optical fingerprint module according to claim 11, wherein each of the active display pixels comprises an element region, a light-emitting device region and a surrounding region, the element region and the light-emitting device region are light blocking regions, and the surrounding region is a non-opaque region.

13. The optical fingerprint module according to claim 6, wherein the OLED display panel provides light as a light source when the optical fingerprint sensor captures fingerprint.

14. The optical fingerprint module according to claim 6, further comprising a protective layer, wherein the OLED display panel is disposed between the protective layer and the optical fingerprint sensor.

15. The optical fingerprint module according to claim 14, wherein a touch-sensitive layer is disposed between the second non-opaque substrate and the protective layer, or between the second non-opaque substrate and the OLED device layer.

* * * * *